United States Patent
Toriumi et al.

(10) Patent No.: US 9,647,074 B2
(45) Date of Patent: May 9, 2017

(54) SEMICONDUCTOR-SUBSTRATE MANUFACTURING METHOD AND SEMICONDUCTOR-DEVICE MANUFACTURING METHOD IN WHICH GERMANIUM LAYER IS HEAT-TREATED

(71) Applicant: JAPAN SCIENCE AND TECHNOLOGY AGENCY, Kawaguchi-shi, Saitama (JP)

(72) Inventors: Akira Toriumi, Tokyo (JP); Choong-hyun Lee, Tokyo (JP); Tomonori Nishimura, Tokyo (JP)

(73) Assignee: JAPAN SCIENCE AND TECHNOLOGY AGENCY, Kawaguchi-Shi (JP)

( * ) Notice: Subject to any disclaimer, the term of this patent is extended or adjusted under 35 U.S.C. 154(b) by 0 days.

(21) Appl. No.: 15/031,437

(22) PCT Filed: Oct. 10, 2014

(86) PCT No.: PCT/JP2014/077135
§ 371 (c)(1),
(2) Date: Apr. 22, 2016

(87) PCT Pub. No.: WO2015/064338
PCT Pub. Date: May 7, 2015

(65) Prior Publication Data
US 2016/0276445 A1    Sep. 22, 2016

(30) Foreign Application Priority Data
Oct. 31, 2013   (JP) ................................ 2013-227559

(51) Int. Cl.
*H01L 29/36* (2006.01)
*H01L 21/28* (2006.01)
(Continued)

(52) U.S. Cl.
CPC ........ *H01L 29/36* (2013.01); *H01L 21/28255* (2013.01); *H01L 21/322* (2013.01);
(Continued)

(58) Field of Classification Search
CPC . H01L 29/36; H01L 21/322; H01L 21/28255; H01L 21/3247; H01L 29/16; H01L 21/324; H01L 29/78; H01L 29/517
See application file for complete search history.

(56) References Cited

U.S. PATENT DOCUMENTS

2001/0034089 A1* 10/2001 Yamazaki ........... H01L 27/1214
                                                                 438/166
2004/0075106 A1    4/2004 Takenaka
(Continued)

FOREIGN PATENT DOCUMENTS

JP         05082443 A  *  4/1993
JP     2000-232228 A     8/2000
(Continued)

OTHER PUBLICATIONS

J.M. Hartmann et al., "Impact of the H2 anneal on the structural and optical properties of thin and thick Ge layers on Si; Low temperature surface passivation of Ge by Si", Journal of Crystal Growth, vol. 312, No. 4, pp. 532-541 (2010).
(Continued)

*Primary Examiner* — Jarrett Stark

(57) ABSTRACT

A method of manufacturing a semiconductor substrate includes: heat-treating a germanium layer 30 with an oxygen concentration of $1\times10^{16}$ $cm^{-3}$ or greater in a reducing gas atmosphere at 700° C. or greater. Alternatively, a method of manufacturing a semiconductor substrate includes heat-treating a germanium layer 30 having an oxygen concentration of $1\times10^{16}$ $cm^{-3}$ or greater in a reducing gas atmosphere so that the oxygen concentration decreases.

6 Claims, 13 Drawing Sheets

(51) Int. Cl.
*H01L 21/322* (2006.01)
*H01L 21/324* (2006.01)
*H01L 29/16* (2006.01)
*H01L 29/78* (2006.01)
*H01L 29/51* (2006.01)

(52) U.S. Cl.
CPC ........ *H01L 21/324* (2013.01); *H01L 21/3247* (2013.01); *H01L 29/16* (2013.01); *H01L 29/78* (2013.01); *H01L 29/517* (2013.01)

(56) References Cited

U.S. PATENT DOCUMENTS

| | | |
|---|---|---|
| 2009/0267068 A1 | 10/2009 | Dairiki et al. |
| 2010/0308376 A1 | 12/2010 | Takada et al. |
| 2011/0180903 A1 | 7/2011 | Hata |
| 2012/0032234 A1 | 2/2012 | Wang et al. |

FOREIGN PATENT DOCUMENTS

| | | |
|---|---|---|
| JP | 2008-205517 A | 9/2008 |
| JP | 2009-177167 A | 8/2009 |
| JP | 2010-103296 A | 5/2010 |
| JP | 2012-039115 A | 2/2012 |
| KR | 10-2010-0094460 A | 8/2010 |
| TW | 200414312 A | 8/2004 |
| TW | 201007949 A | 2/2010 |
| TW | 201019375 A | 5/2010 |
| WO | 2004/086475 A1 | 10/2004 |

OTHER PUBLICATIONS

Yusuke Hoshi et al., "Formation of Tensilely Strained Germanium-on-Insulator", Applied Physics Express, vol. 5, No. 1, pp. 015701-1 to 015701-3 (2012).

S. Kobayashi et al., "Effect of isochronal hydrogen annealing on surface roughness and threading dislocation density of epitaxial Ge films grown on Si", Thin Solid Films, vol. 518, Issue 6, pp. S136-S139 (2010).

Choong Hyun Lee et al., "Control of Surface Roughness on Ge by Wet Chemical Treatments and its Effects on Electron Mobility in n-FETs", Extended Abstracts of the 2011 International Conference on Solid State Devices and Materials, Nagoya, pp. 925-926 (2011).

T. Nishimura et al., "Atomically Flat Planarization of Ge (110) and (100) Surface by H2 Annealing", Proceedings of the 74th JSAP Autumn Meeting, 2013, The Japan Society of Applied Physics, p. 13-048.

The Intellectual Property Bureau Ministry of Economic Affairs, "Office Action", issued in TW Patent Application No. 103136023, which is a Taiwanese counterpart application to Japanese Appl. Ser. No. 2013-227559, mailed on Sep. 21, 2015, 9 pages (4 pages of English translation and 5 pages of Office Action).

The Intellectual Property Bureau Ministry of Economic Affairs, "Office Action", issued in TW Patent Application No. 103136023, which is a Taiwanese counterpart application to Japanese Appl. Ser. No. 2013-227559, mailed on Jan. 30, 2016, 12 pages (5 pages of English translation and 7 pages of Office Action).

International Search Report received for PCT Application No. PCT/JP2014/077135 mailed on Jan. 20, 2015, 4 pages (2 pages of English translation of International Search Report, 2 pages of International Search Report).

Korean Intellectual Property Office, "Notification of Submission of Opinion", issued in Korean Patent Application No. 2016-7010034, which is a Korean counterpart of U.S. Appl. No. 15/031,437, on Feb. 14, 2017, 16 pages (9 pages of English translation, and 7 pages of the original Notification of Submission of Opinion).

* cited by examiner (111) 500°C 1 μm SQUARE AREA (111) 650°C 1 μm SQUARE AREA (111) 850°C 1 μm SQUARE AREA APPROXIMATELY 0.3 nm APPROXIMATELY 0.3 nm APPROXIMATELY 0.3 nm H₂ 750°C 1 μm SQUARE AREA N₂ 750°C 1 μm SQUARE AREA H₂ 750°C 20 μm SQUARE AREA APPROXIMATELY 0.3 nm N₂ 750°C 20 μm SQUARE AREA

SEMICONDUCTOR-SUBSTRATE MANUFACTURING METHOD AND SEMICONDUCTOR-DEVICE MANUFACTURING METHOD IN WHICH GERMANIUM LAYER IS HEAT-TREATED

CROSS REFERENCE TO RELATED APPLICATIONS

This patent application is a U.S. national stage application under 35 U.S.C. §371 of International Patent Application No. PCT/JP2014/077135 filed on Oct. 10, 2014, which claims the benefit of foreign priority to Japanese Patent Application No. JP 2013-227559 filed on Oct. 31, 2013. The International Application was published in Japanese on May 7, 2015, as International Publication No. WO 2015/064338 A1 under PCT Article 21(2).

TECHNICAL FIELD

The present invention relates to a method of manufacturing a semiconductor substrate and a method of manufacturing a semiconductor device, and more particularly to a method of manufacturing a semiconductor substrate in which a germanium layer is heat-treated and a method of manufacturing a semiconductor device in which a germanium layer is heat-treated.

BACKGROUND ART

Germanium (Ge) is a semiconductor having electronic properties better than those of silicon (Si). For example, a MOSFET (Metal Oxide Semiconductor Field Effect Transistor) using germanium has been developed. For example, in the MOSFET, it is important to improve the mobility of a carrier in a germanium layer.

PRIOR ART DOCUMENT

Non-Patent Document

Non-Patent Document 1: Extended Abstract of the 2011 International Conference on Solid State Devices and Materials, Nagoya, 2011, pp 925-926

SUMMARY OF THE INVENTION

Problem to Be Solved By the Invention

In a single crystal germanium substrate, the mobility greatly differs depending on the type of the substrate. When the mobility of the germanium substrate is low, high performance is not obtained in a semiconductor device such as a MOSFET. It is required to improve the mobility of the germanium layer and enhance the performance of the semiconductor device.

The present invention has been made in view of the above problems, and aims to provide a high-performance semiconductor device.

Means for Solving the Problem

The present invention is a method of manufacturing a semiconductor substrate characterized by including: heat-treating a germanium layer having an oxygen concentration of $1\times10^{16}$ cm$^{-3}$ or greater in a reducing gas atmosphere at 700° C. or greater.

The present invention is a method of manufacturing a semiconductor substrate characterized by including: heat-treating a germanium layer having an oxygen concentration of $1\times10^{16}$ cm$^{-3}$ or greater in a reducing gas atmosphere so that the oxygen concentration decreases.

In the above configuration, the heat-treating may be configured to include heat-treating the germanium layer at 800° C. or greater.

In the above configuration, the oxygen concentration of the germanium layer may be configured to become less than $1\times10^{16}$ cm$^{-3}$ by the heat-treating.

In the above configuration, the germanium layer may be configured to have a (111) plane as a principal plane.

In the above configuration, the reducing gas atmosphere may be configured to be a hydrogen gas atmosphere.

In the above configuration, the germanium layer may be configured to be a single crystal germanium substrate.

The present invention is a method of manufacturing a semiconductor device characterized by including: forming a semiconductor device on a semiconductor substrate manufactured by the above method of manufacturing a semiconductor substrate.

In the above configuration, the forming of the semiconductor device may be configured to include: forming a gate insulating film on a surface of the germanium layer that has undergone the heat-treating; and forming a gate electrode on the gate insulating film.

Effects of the Invention

The present invention provides a high-performance semiconductor device.

MODES FOR CARRYING OUT THE EMBODIMENTS

When a MOS structure is fabricated with a single crystal germanium substrate and the mobility thereof is measured, the mobility differs depending on the type of the substrate. As an example, the mobility differs depending on a growth system that grows a substrate, growth conditions, and materials. However, it is not clear yet whether the difference in mobility depends on the growth procedure itself, or any other factor. Moreover, the mobility differs also in a germanium layer formed on the substrate. The reason why the mobility differs depending on the type of the substrate or the type of the layer is not clear yet. Therefore, the mobility is difficult to improve.

To investigate the reason why the mobility differs depending on the type of the substrate or the type of the layer, a substrate A and a substrate B of which the growth procedures differ from each other were prepared as single crystal germanium substrates having different mobilities. The substrate B has a mobility lower than the mobility of the substrate A. MOS structures were fabricated with the substrate A and the substrate B, and the following experiment was conducted.

Figure 1A:
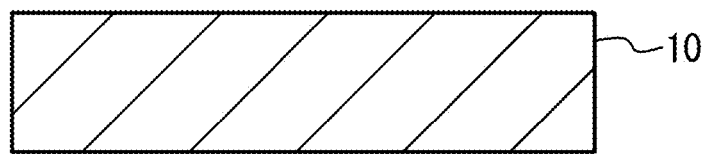
FIG. 1A through FIG. 1D are cross-sectional views illustrating a method of fabricating a MOS structure that was used for an experiment.

FIG. 1A through FIG. 1D are cross-sectional views illustrating a method of fabricating a MOS structure that was used for the experiment. As illustrated in FIG. 1A, a P-type single crystal germanium substrate 10 is prepared. As the single crystal germanium substrate, the substrate A or the substrate B is used. In the following description, the substrate A having a (111) plane as a principal plane is referred to as a (111) substrate A, and the substrate B having a (111) plane as a principal plane is referred to as a (111) substrate B. The germanium substrate 10 has an acceptor concentration $N_A$ of $2 \times 10^{15}$ cm$^{-3}$.

Figure 1B:
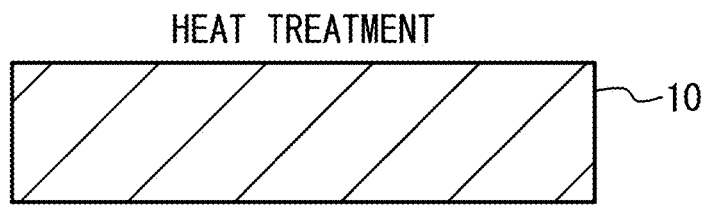
Figure 1C:
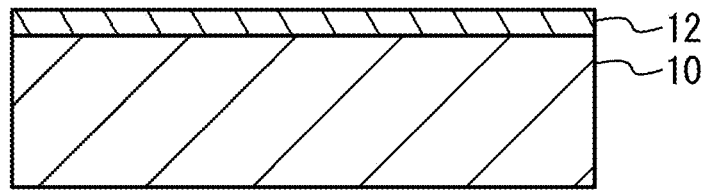
Figure 1D:
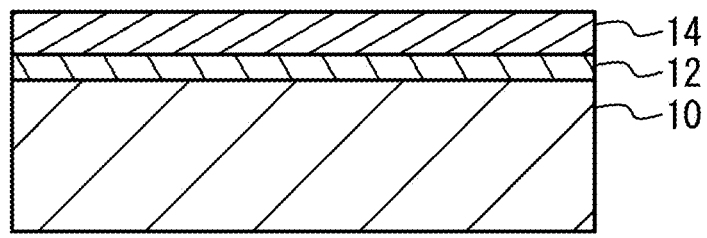

As illustrated in FIG. 1B, heat treatment is conducted in a hydrogen (H$_2$) gas atmosphere (100% hydrogen gas atmosphere) at a pressure of 1 atm. Hereinafter, the heat treatment in a hydrogen gas atmosphere is also referred to as hydrogen heat treatment. As illustrated in FIG. 1C, a germanium oxide film 12 is formed on the germanium substrate 10. The germanium oxide film 12 is formed by heat-treating the germanium substrate 10 in an oxygen gas atmosphere. The germanium oxide film 12 is formed at an oxygen pressure of 70 atm at a substrate temperature of 500° C. The germanium oxide film 12 has a film thickness of approximately 5 to 6 nm. As illustrated in FIG. 1D, a gold (Au) film as a metal film 14 is formed on the surface of the germanium oxide film 12. The metal film 14 is used as a gate electrode.

With use of the (111) substrate A, fabricated was a MOS structure having a gate length of 100 μm and a gate width of 25 μm. The carrier number and the mobility $\mu_{eff}$ at room temperature are obtained by a split CV method. The split CV method derives the carrier number from the integral of the CV measurement, and calculates the mobility from the carrier number and the I-V measurement. The surface electron density $N_s$ was calculated from the carrier number.

Figure 2:
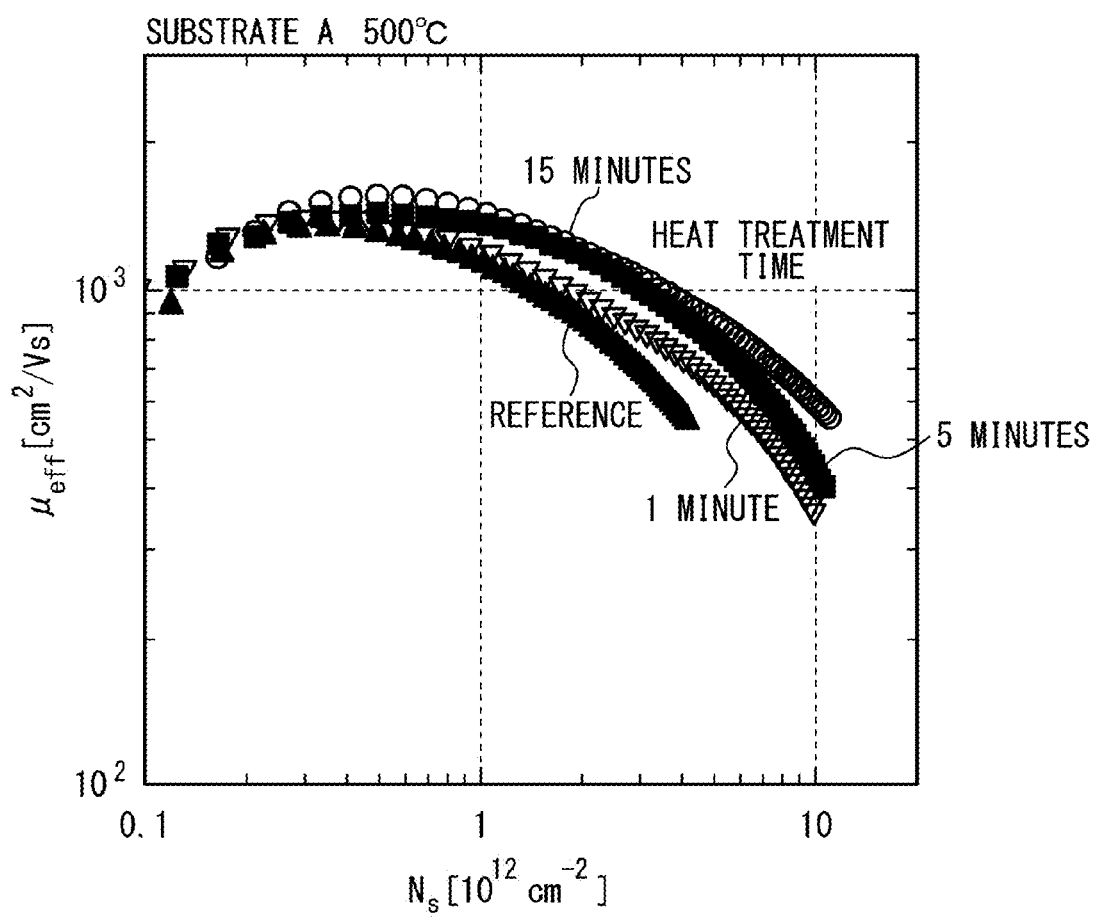
FIG. 2 is a graph of mobility $\mu_{eff}$ versus surface electron density $N_s$ in a (111) substrate A.

FIG. 2 is a graph of mobility $\mu_{eff}$ versus surface electron density $N_s$ in the (111) substrate A. Gate voltage was applied to the gate electrode to change the surface electron density $N_s$, and the mobility $\mu_{eff}$ was measured. The hydrogen heat treatment in FIG. 1B was conducted at a temperature of 500° C. for 1 minute, 5 minutes, and 15 minutes. The reference sample is a sample without undergoing the hydrogen heat treatment of FIG. 1B, has a film thickness of a germanium oxide film of 15 nm, and the film formation temperature of the germanium oxide film is high. The reference sample has a maximum mobility of approximately 1200 cm$^2$/Vs when the surface electron density is $4 \times 10^{11}$ cm$^{-2}$. In the region where the surface electron density is lower than the peak of the mobility, the mobility hardly changes with respect to the heat treatment time. In the region where the surface electron density is higher than the peak of the mobility, the mobility increases as the heat treatment time increases. As the surface electron density increases, the difference in mobility due to the heat treatment time increases.

Figure 3A:
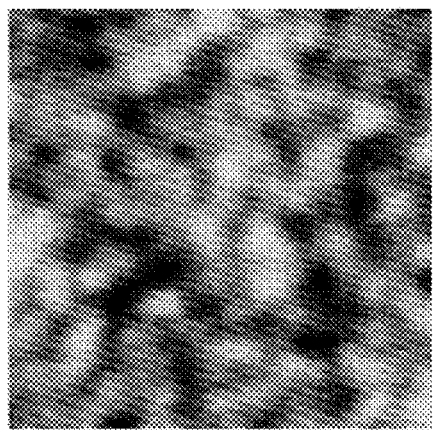
FIG. 3A through FIG. 3C are AFM images of the surface of a substrate after hydrogen heat treatment in the (111) substrate A.
Figure 3B:
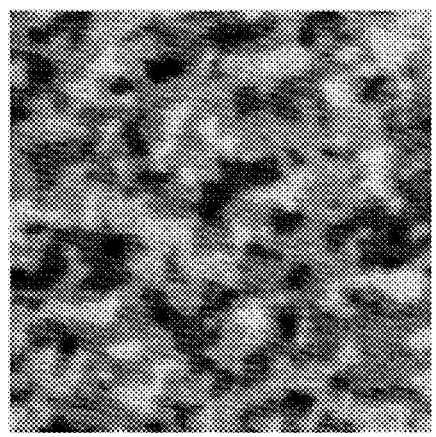
Figure 3C:
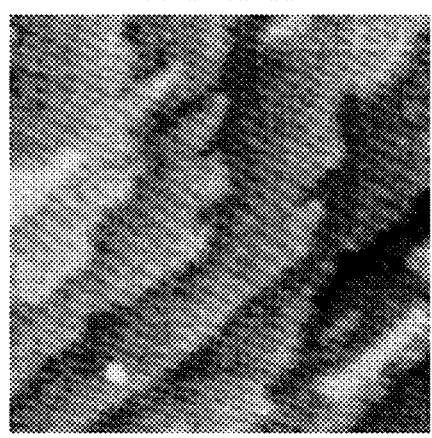

After FIG. 1B, the surface of the germanium substrate 10 of the substrate A was observed by AFM (Atomic Force Microscopy). FIG. 3A through FIG. 3C are AFM images of the surface of the substrate after the hydrogen heat treatment in the (111) substrate A. FIG. 3A is the AFM image of the germanium substrate 10 that underwent the hydrogen heat treatment in FIG. 1B at a temperature of 500° C. for 1 minute, FIG. 3B is the AFM image of the germanium substrate 10 that underwent the hydrogen heat treatment at a temperature of 500° C. for 5 minutes, and FIG. 3C is the AFM image of the germanium substrate 10 that underwent the hydrogen heat treatment at a temperature of 500° C. for 15 minutes. The AFM image corresponds to an area of 1 μm×1 μm (a 1 μm square area). As illustrated in FIG. 3A, when the heat treatment time is 1 minute, a step and terrace structure is not observed on the surface of the germanium substrate 10. As illustrated in FIG. 3B, when the heat treatment time is 5 minutes, a small step and terrace structure is observed on the surface of the germanium substrate 10. As illustrated in FIG. 3C, when the heat treatment time is 15 minutes, a step and terrace structure is observed on the surface of the germanium substrate 10. As described above, when the heat treatment time is long, a step and terrace structure is observed. When a step and terrace structure is observed, this means the surface has a high flatness.

FIG. 2 is compared with FIG. 3A through FIG. 3C. At a heat treatment temperature of 500° C., as the heat treatment time increases, the mobility increases in the region where the surface electron density is high. This is considered to be because the flatness of the interface between the germanium substrate 10 and the germanium oxide film 12 improves as the heat treatment time increases.

Thus, for the (111) substrate A, conducted was an experiment in the planarization of the surface of the germanium substrate 10 by heat treatment.

Figure 4A:
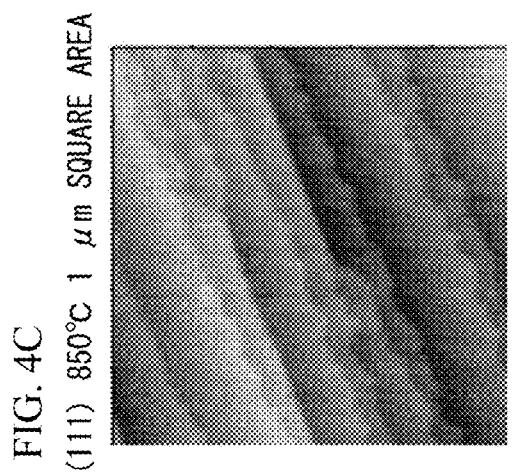
FIG. 4A through FIG. 4F are diagrams illustrating AFM observations after hydrogen heat treatment in the (111) substrate A.
Figure 4B:
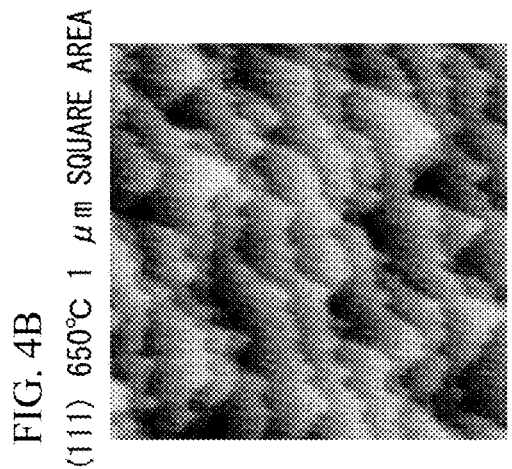
Figure 4C:
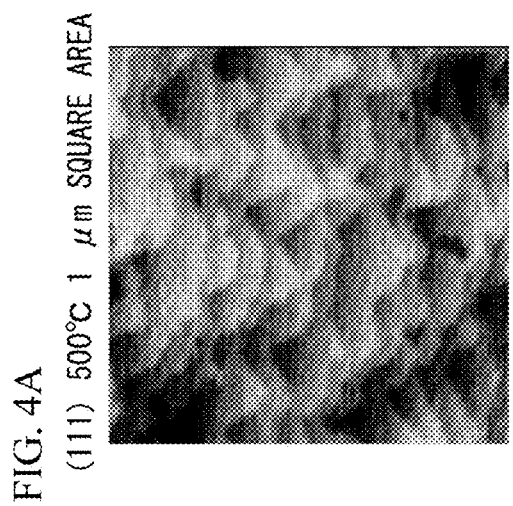
Figure 4D:
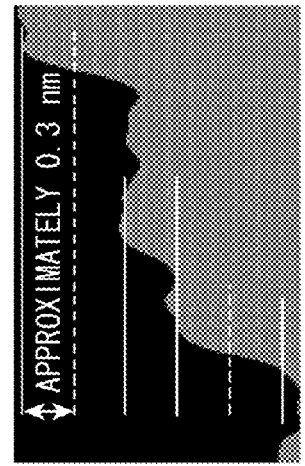
Figure 4E:
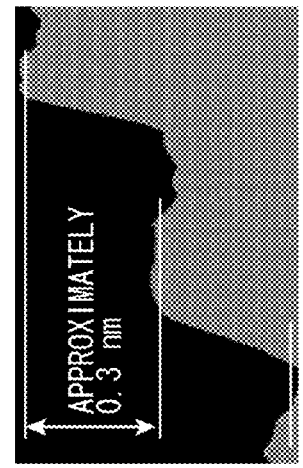
Figure 4F:
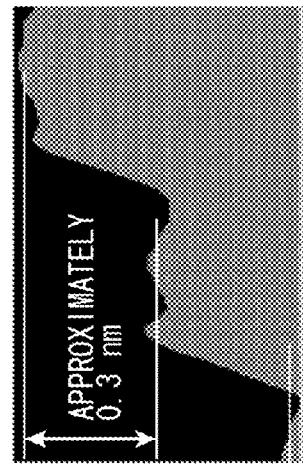

FIG. 4A through FIG. 4F are diagrams illustrating AFM observations of the surface of the substrate A after the hydrogen heat treatment in the (111) substrate A. FIG. 4A is the AFM observation image of the surface of the (111) substrate A that has undergone the hydrogen heat treatment at 500° C., FIG. 4B is the AFM observation image of the surface of the (111) substrate A that has undergone the hydrogen heat treatment at 650° C., and FIG. 4C is the AFM observation image of the surface of the (111) substrate A that has undergone the hydrogen heat treatment at 850° C. The heat treatment time is 15 minutes. The area of the image is a 1 μm square area. FIG. 4D through FIG. 4F respectively illustrate the surface in the film thickness direction of the substrate to the surface direction of the substrate in a partial region of FIG. 4A through FIG. 4C, and correspond to cross-sections.

As illustrated in FIG. 4A through FIG. 4C, when the heat treatment temperature was between 500° C. and 850° C., a step and terrace structure is observed. As illustrated in FIG. 4D through FIG. 4F, the height of the step is approximately 0.3 nm or twice as high as approximately 0.3 nm. Germanium takes a diamond structure, and has a lattice constant of 0.567 nm. In the (111) plane, the thickness of a single layer of atoms based on a regular tetrahedral bonding structure making up the diamond structure is $0.567 \times 3^{-1/2}$ nm and is approximately 0.33 nm. The thickness corresponds to two bonds between Ge atoms. Accordingly, as illustrated in FIG. 4D through FIG. 4F, the height of the step corresponds to approximately one atomic layer. As described above, in the (111) substrate A, when the temperature of the hydrogen heat treatment is between 500° C. and 850° C., a step and terrace structure is formed on the surface of the germanium substrate 10.

Figure 5:
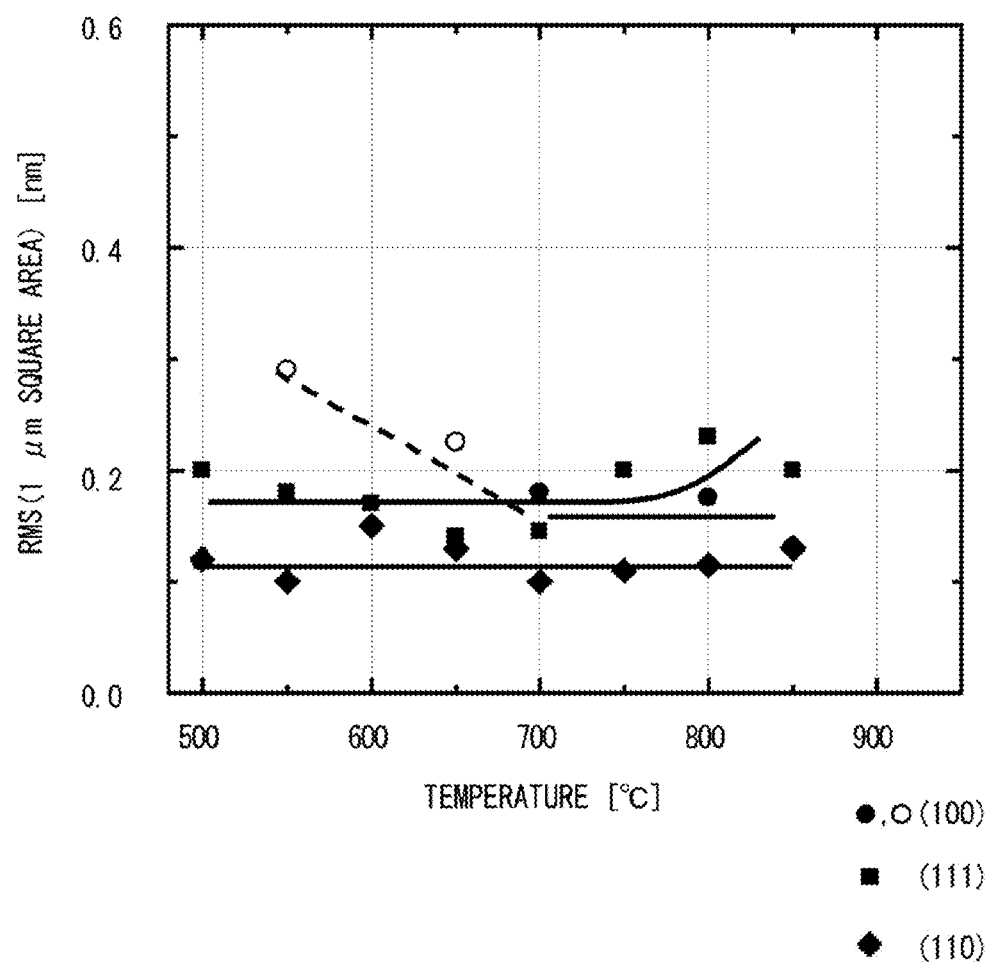
FIG. 5 is a graph of RMS within a 1 µm square area versus heat treatment temperature in hydrogen heat treatment of substrates A with different crystal orientations.

FIG. 5 is a graph of RMS (Root Mean Square) in a 1 μm square area versus temperature of hydrogen heat treatment of the substrates A with different crystal orientations. The heat treatment time is 15 minutes. The dots represent measurement points, and the lines represent approximate lines. The RMS of the substrate before the hydrogen heat treatment is approximately 0.3 nm. The (111) substrate A is indicated by (111). The substrate A having a (110) principal plane is indicated by (110), and the substrate A having a (100) principal plane is indicated by (100).

As illustrated in FIG. 5, in the (111) and (110) substrates, a step and terrace structure was observed at all temperatures at intervals of 50° C. between 500° C. and 850° C. In the (100) substrate, the black circles indicate that a step and terrace structure was observed, and the open circles indicate that a step and terrace structure was not observed. In the (100) substrate, when the heat treatment temperature is 700° C. or greater, a step and terrace structure is observed. In the (111), (110), and (100) substrates, within the temperature range between 500° C. and 850° C., the RMS of the substrate surface can be reduced to less than approximately 0.3 nm. In the (110) substrate, the RMS is 0.2 nm or less within the temperature range between 500° C. and 850° C. In the (111) substrate, the RMS is 0.2 nm or less within the temperature range between 550° C. and 750° C. In the (100) substrate, the RMS is 0.2 nm or less within the temperature range equal to or greater than 700° C.

As described above, the hydrogen heat treatment planarizes the surface of the germanium substrate 10 almost regardless of the plane orientation of the germanium substrate 10.

Figure 6A:
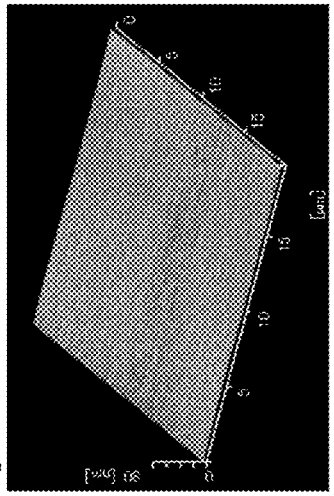
FIG. 6A through FIG. 6E are diagrams illustrating AM observations of the surface of the substrate A after heat treatment in the (111) substrate A.
Figure 6B:
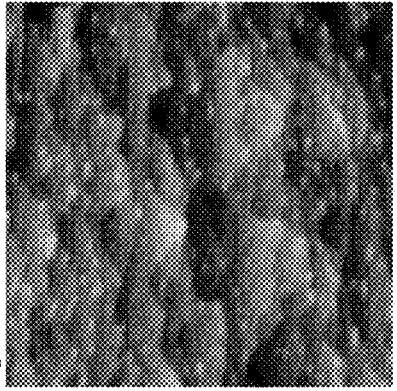
Figure 6D:
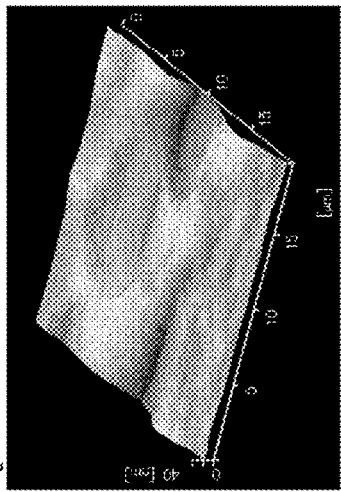
Figure 6C:
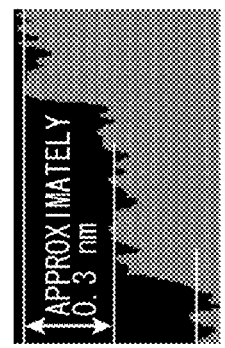
Figure 6E:
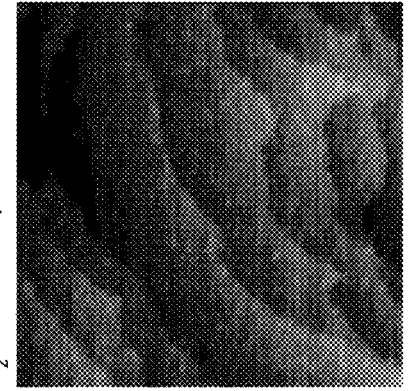

The atmosphere of the heat treatment was changed, and an experiment in the planarization of the surface of the germanium substrate 10 was conducted. FIG. 6A through FIG. 6E are diagrams illustrating AFM observations of the surface of the substrate after the heat treatment in the (111) substrate A. FIG. 6A is the AFM observation image of the surface of the (111) substrate A that has undergone heat treatment in a hydrogen gas atmosphere, and FIG. 6B is the AFM observation image of the surface of the (111) substrate A that has undergone heat treatment in a nitrogen gas atmosphere (nitrogen heat treatment). The heat treatment temperature is 750° C., and the heat treatment time is 15 minutes. The area of the image is a 1 μm square area. FIG. 6C is a diagram illustrating the surface in the film thickness direction of the substrate with respect to the surface direction of the substrate in a partial region of FIG. 6B, and corresponds to the cross-section. FIG. 6D is the AFM observation image (perspective view) of the surface of the substrate A that has undergone heat treatment in a hydrogen gas atmosphere, and FIG. 6E is the AFM observation image (perspective view) of the surface of the substrate A that has undergone heat treatment in a nitrogen gas atmosphere. The area of the image is a 20 μm square area.

As demonstrated in FIG. 6B and FIG. 6C, when the nitrogen heat treatment was conducted, a step and terrace structure is observed. The RMS in a 1 μm square area by the hydrogen heat treatment is approximately 0.2 nm, while the RMS in a 1 μm square area by the nitrogen heat treatment is approximately 0.2 to 0.5 nm.

As described above, the surface of the germanium substrate is planarized even when the heat treatment is conducted not in a hydrogen gas atmosphere but in an inert gas atmosphere such as a nitrogen gas. This demonstrates that the surface of the germanium substrate 10 is planarized by heat treatment without oxidizing the surface of the germanium substrate 10. That is to say, the gas used in the heat treatment may be any of a reducing gas and an inert gas.

The experimental results presented in FIG. 2 through FIG. 6E reveal that the surface of the germanium substrate 10 is planarized when the heat treatment is conducted in a reducing gas atmosphere or in an inert gas atmosphere at a temperature of approximately 500° C. or greater. When the surface of the germanium substrate 10 is planarized, the mobility in the region with a high surface electron concentration improves as illustrated in FIG. 2. As illustrated in FIG. 5, the flatness is almost the same when the heat treatment temperature is between 500° C. and 850° C. As illustrated in FIG. 3A through FIG. 3C, when the heat treatment temperature is around 500° C., the flatness depends on the heat treatment time. Although the experimental results of the substrate A have been described, the surface of the substrate is also planarized in the substrate B as with the substrate A. As described above, the heat treatment planarizes the surface of the substrate regardless of the type of the substrate.

The mobility $\mu_{eff}$ of the substrate B having a (111) plane as a principal plane (referred to as a (111) substrate B) was measured by a split CV method. The germanium substrate 10 has an acceptor concentration $N_A$ of $2 \times 10^{15}$ cm$^{-3}$. The (111) substrate B has a maximum mobility of approximately 300 cm$^2$/Vs.

Figure 7:
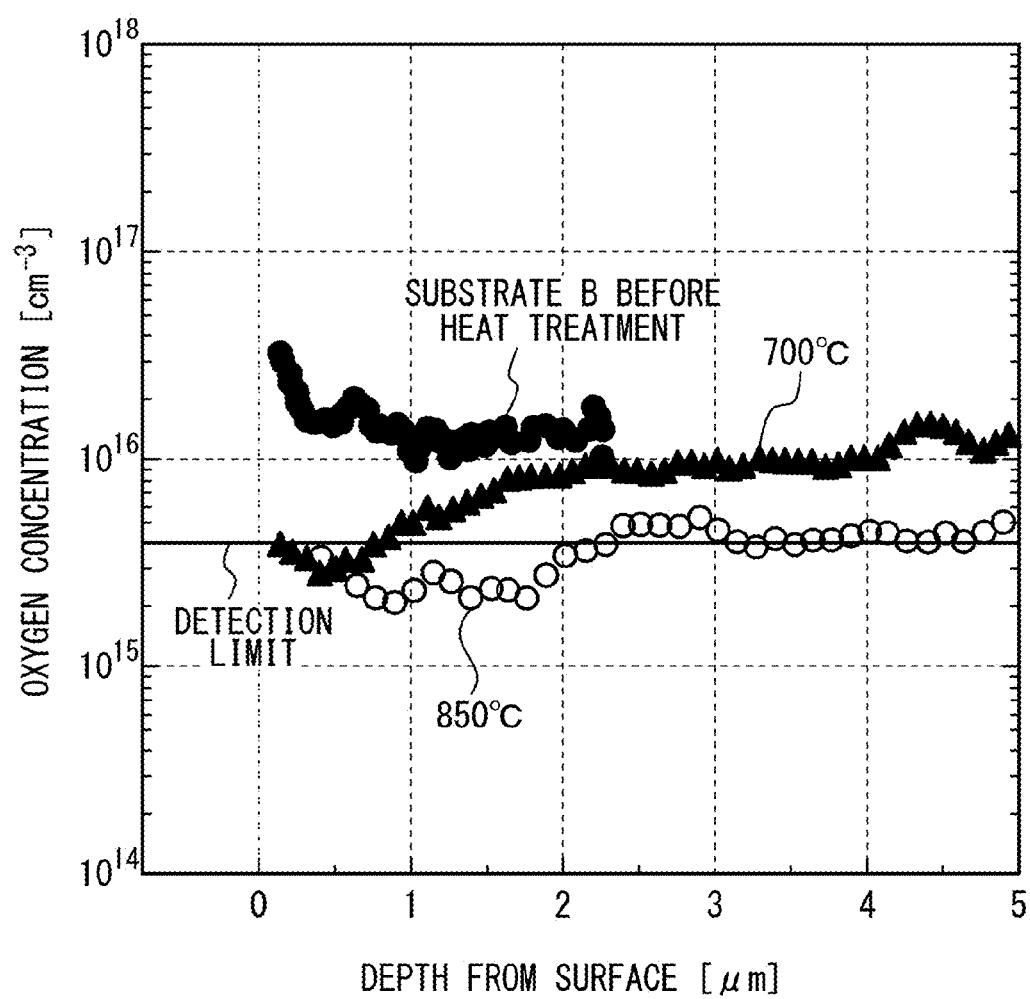
FIG. 7 is a graph of oxygen concentration versus depth in a (111) substrate B.

The substrate A and the substrate B were analyzed by SIMS (Secondary Ion Mass Spectroscopy). FIG. 7 is a graph of oxygen concentration versus depth in the (111) substrate B. The black circles represent the results of the SIMS analysis before the (111) substrate B underwent the hydrogen heat treatment, the black triangles represent the results of the SIMS analysis after the (111) substrate B underwent the hydrogen heat treatment at 700° C., and the open circles represent the results of the SIMS analysis after the (111) substrate B underwent the hydrogen heat treatment at 850° C. The heat treatment time is 15 minutes. In the substrate B before the hydrogen heat treatment, the oxygen concentration is $1 \times 10$ cm$^{16}$ cm$^{-3}$ or greater at a depth from the surface of less than at least 2 μm. The oxygen concentration is $1.5 \times 10^{16}$ cm$^{-3}$ or greater at a depth from the surface of less than 1 μm. On the other hand, in the (111) substrate A, the oxygen concentration is below the detection limit. As described above, the substrate B has an oxygen concentration greater than the oxygen concentration of the substrate A. Thus, it is estimated that the low mobility in the substrate B has some kind of relationship with the oxygen concentration in the germanium substrate 10.

Furthermore, when the hydrogen heat treatment is conducted at 700° C., the oxygen concentration in the substrate B decreases to $1 \times 10^{16}$ cm$^{-3}$ or less. When the hydrogen heat treatment is conducted at 850° C., the oxygen concentration in the substrate B becomes $4 \times 10^{15}$ cm$^{-3}$, which is the detection limit, or less. As described above, as the temperature of the hydrogen heat treatment is increased, the oxygen concentration in the germanium substrate 10 decreases.

Figure 8:
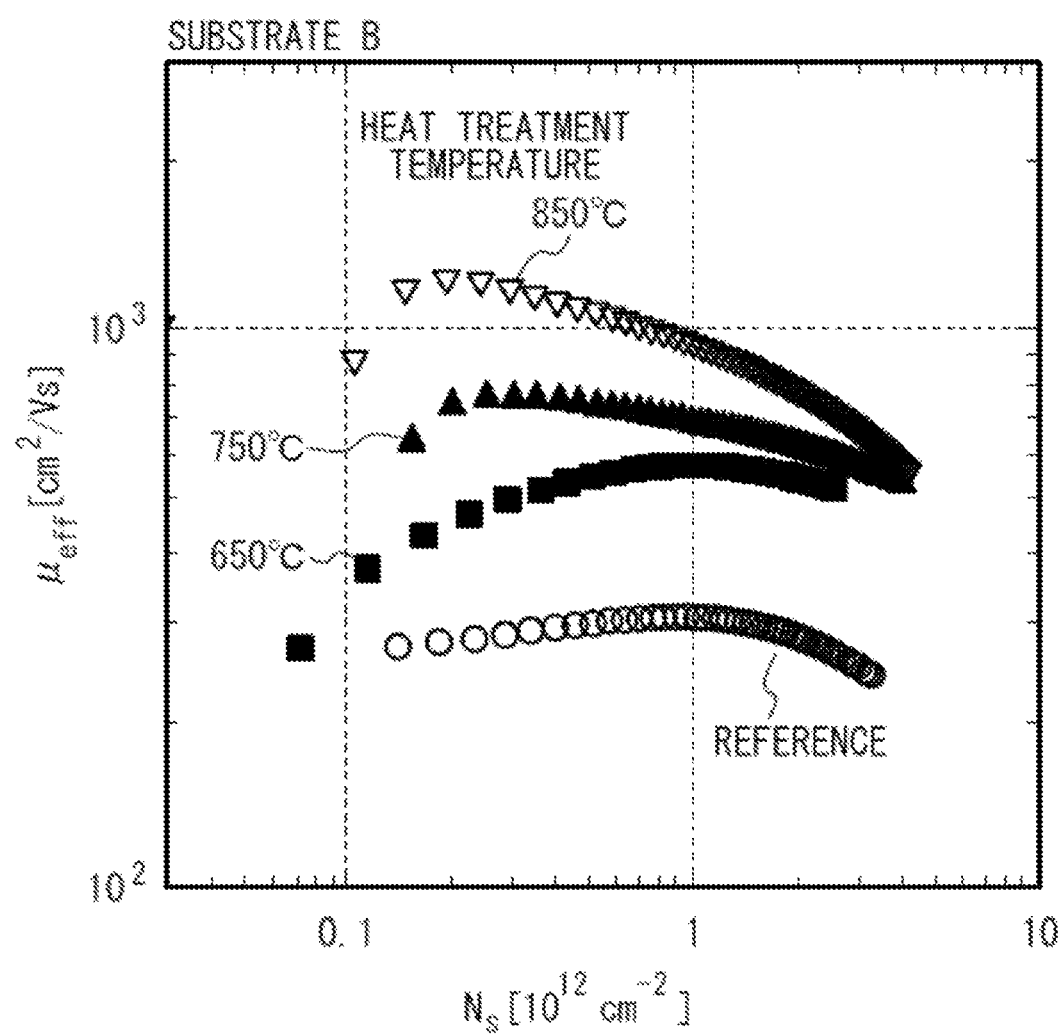
FIG. 8 is a graph of mobility $\mu_{eff}$ versus surface electron density $N_s$ in the (111) substrate B.

For the (111) substrate B, samples that underwent hydrogen heat treatment at different heat treatment temperatures were fabricated to measure the mobility. The fabrication process is the same as the fabrication process of the (111) substrate A illustrated in FIG. 2 except the substrate and the heat treatment. FIG. 8 is a graph of mobility $\mu_{eff}$ versus surface electron density $N_s$ in the (111) substrate B. The heat treatment temperature in FIG. 1B is 650° C., 750° C., and 850° C., and the heat treatment time is 15 minutes. The reference sample is a sample without undergoing the heat treatment in FIG. 1B, has a film thickness of a germanium oxide film of 15 nm, and the film formation temperature of the germanium oxide film is high. The reference sample has a maximum mobility of approximately 300 $cm^2$/Vs. When the heat treatment temperature is 650° C., the maximum mobility improves to approximately 600 $cm^2$/Vs. When the heat treatment temperature is 750° C., the maximum mobility further improves to approximately 800 $cm^2$/Vs. When the heat treatment temperature is 850° C., the maximum mobility is approximately 1200 $cm^2$/Vs, and almost the same as that of the substrate A.

When FIG. 7 is compared with FIG. 8, as the temperature of the hydrogen heat treatment increases, the oxygen concentration in the substrate B decreases, and the mobility improves. When the temperature of the hydrogen heat treatment is 850° C., the oxygen concentration in the substrate B is approximately the detection limit, and the mobility is approximately the same as that of the substrate A. As described above, the oxygen concentration in the germanium substrate 10 correlates with the mobility. To improve the mobility, the heat treatment temperature is preferably 750° C. or greater, more preferably 800° C. or greater, further preferably 850° C. or greater. Since the melting point of germanium is approximately 938° C., the heat treatment temperature is preferably 925° C. or less, more preferably 900° C. or less.

It is not clear why the oxygen concentration decreases as the heat treatment temperature of the hydrogen heat treatment increases in the substrate B. It may be because oxygen in the germanium substrate 10 is removed by a reducing gas, for example.

To confirm that the oxygen concentration in the germanium substrate is reduced by the hydrogen heat treatment, oxygen ions were ion implanted into the germanium substrate 10 of the (111) substrate A, and the heat treatment was then conducted. A sample heat-treated in a nitrogen gas atmosphere and a sample heat-treated in a hydrogen gas atmosphere were fabricated. The fabrication process is the same as that of the (111) substrate A illustrated in FIG. 2 except the ion implantation and the heat treatment.

Figure 9:
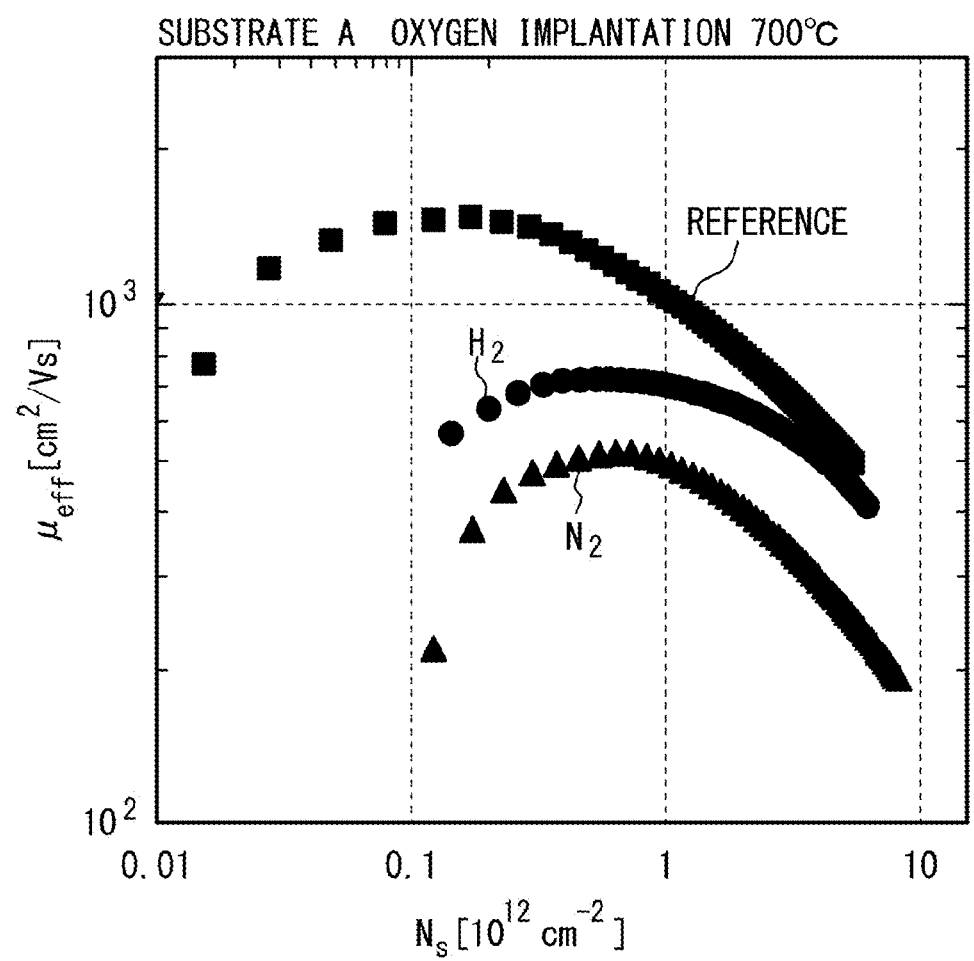
FIG. 9 is a graph of mobility $\mu_{eff}$ versus surface electron density $N_s$ of a sample fabricated by ion implanting oxygen ions into the (111) substrate A.

FIG. 9 is a graph of mobility $\mu_{eff}$ versus surface electron density $N_s$ of the sample fabricated by ion implanting oxygen ions into the (111) substrate A. The heat treatment temperature in FIG. 1B is 700° C., and the heat treatment time is 15 minutes. The reference sample is the same as the reference sample of FIG. 2 without undergoing the ion implantation of oxygen and the hydrogen heat treatment. As illustrated in FIG. 9, the reference sample has a maximum mobility of approximately 1200 $cm^2$/Vs. The sample that underwent the nitrogen heat treatment after the oxygen ion implantation has a maximum mobility of approximately 500 $cm^2$/Vs. Whereas the sample that underwent the hydrogen heat treatment after the oxygen ion implantation has a maximum mobility of approximately 800 $cm^2$/Vs. As described above, when oxygen ions are implanted, the mobility decreases. The mobility is not much improved even when the nitrogen heat treatment is conducted after the oxygen ion implantation. In contrast, the mobility improves when the hydrogen heat treatment is conducted.

Figure 10:
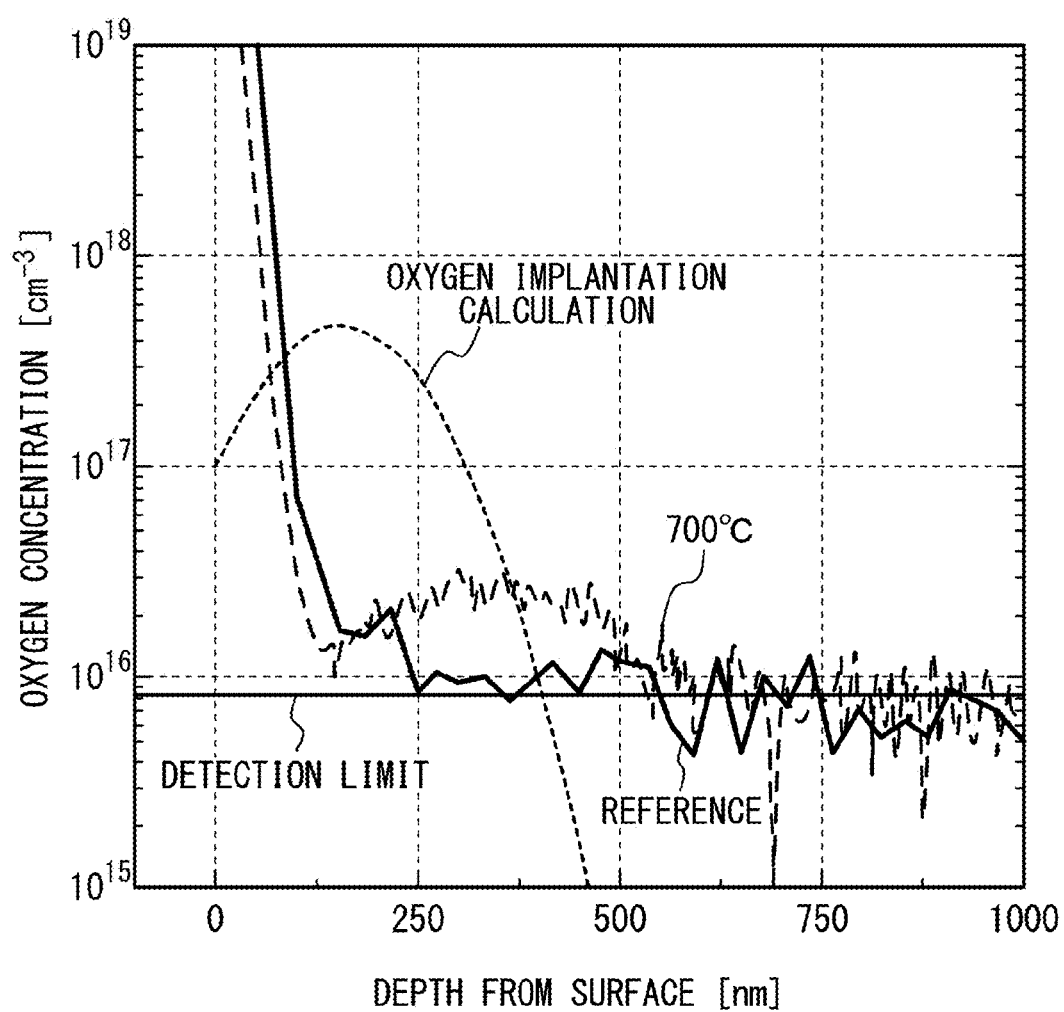
FIG. 10 is a graph of oxygen concentration versus depth from the surface of a sample fabricated by ion implanting oxygen ions into the (111) substrate A.

The sample that had undergone the hydrogen heat treatment at 700° C. was analyzed by SIMS. FIG. 10 is a graph of oxygen concentration versus depth from the surface of a sample fabricated by ion implanting oxygen ions into the (111) substrate A. The solid line represents the results of the SIMS analysis of the reference sample before the hydrogen heat treatment, the dashed line represents the results of the SIMS analysis of the sample after the hydrogen heat treatment at 700° C., and the dotted line represents the calculation result of oxygen ions that were ion implanted. The oxygen concentrations of the results of the SIMS analysis indicated by the solid line and the dashed line are very high in a region where the depth is less than 150 nm. This is because oxygen absorbed by the surface of the germanium substrate 10 is observed. The results in the region where the depth is less than 150 nm are not accurate. In addition, as the measuring speed differs, the detection limit and the behavior in the region where the depth is low differ from those of FIG. 7.

As illustrated in FIG. 10, in the reference sample, the substrate A before oxygen ions are implemented has an oxygen concentration of approximately $8 \times 10^{15}$ $cm^{-3}$, which is the detection limit. As indicated by the calculation result represented by the dotted line, oxygen ions are ion implanted into the germanium substrate 10 so that the oxygen concentration takes a peak of $5 \times 10^{17}$ $cm^{-3}$ at a depth of approximately 150 nm.

When the hydrogen heat treatment is conducted at 700° C., the oxygen concentration is $3 \times 10^{16}$ $cm^{-3}$ at a maximum when the depth is between 150 nm and 600 nm. When the depth is 600 nm or greater, the oxygen concentration is the detection limit. FIG. 10 reveals that the oxygen concentration in the germanium substrate 10 is reduced by hydrogen beat-treating the oxygen-implanted germanium substrate 10. As illustrated in FIG. 9, the hydrogen heat treatment increases the mobility more than the nitrogen heat treatment. Thus, it is considered that the hydrogen heat treatment removes oxygen in the germanium substrate 10 and the mobility thus improves.

The experimental results presented in FIG. 7 through FIG. 10 demonstrate that oxygen in the substrate B is removed and the oxygen concentration is reduced when the substrate B is heat-treated in a reducing gas atmosphere at approximately 700° C. or greater. When the oxygen concentration in the substrate B decreases, the mobility of the substrate B at room temperature becomes approximately the same as the mobility of the substrate A as illustrated in FIG. 9. Accordingly, the defect affecting the mobility is considered to have a relation with oxygen in the substrate B.

Figure 11:
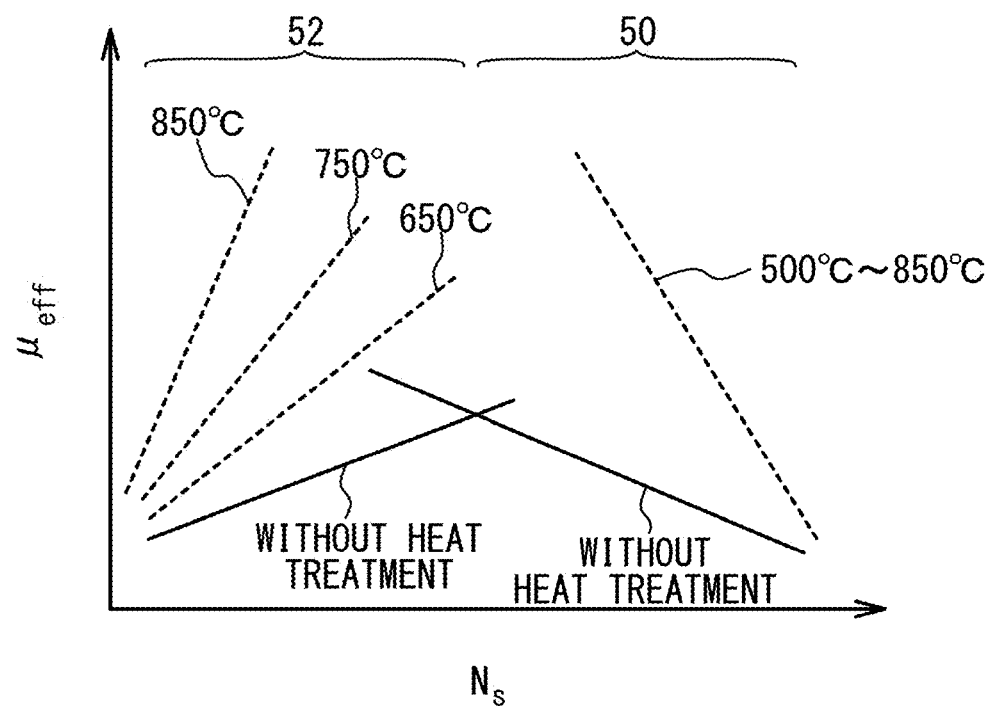
FIG. 11 is a schematic diagram illustrating mobility $\mu_{eff}$ versus surface electron density $N_s$ in the substrate B.

In light of the experimental results presented in FIG. 2 through FIG. 10, the behavior of the mobility with respect to the surface electron density will be described. FIG. 11 is a schematic diagram illustrating mobility $\mu_{eff}$ versus surface electron density $N_s$ in the substrate. A region 50 where the surface electron density is high and a region 52 where the surface electron density is low will be considered. In the region 50, as the surface electron density increases, the mobility decreases. In the region 52, as the surface electron density decreases, the mobility decreases.

The region 50 is considered to be a region where the mobility is limited mainly by the flatness of the surface of the germanium substrate 10. In the region 50, when the heat treatment is conducted in a reducing gas atmosphere or an inert gas atmosphere at a temperature of 500° C. or greater, the flatness of the surface of the germanium substrate 10 improves. As illustrated in FIG. 5, the flatness of the surface of the germanium substrate 10 remains approximately the same even when the heat treatment temperature is increased to greater than 500° C.

The region 52 is considered to be a region where the mobility is limited mainly by the scattering due to the defect relating to oxygen in the germanium substrate 10. In the substrate A, even when the heat treatment is not conducted in a reducing gas atmosphere, the oxygen concentration in the germanium substrate 10 is low. In contrast, in the substrate B, the oxygen concentration in the germanium substrate 10 before the heat treatment in a reducing gas atmosphere is high, and the defect relating to oxygen is formed. When the substrate B is heat-treated in a reducing gas atmosphere, the oxygen concentration in the germanium substrate 10 decreases. The oxygen concentration decreases as the heat treatment temperature increases.

The substrate A has less defects in the germanium substrate 10. Thus, the mobility in the region 52 is high even before the hydrogen heat treatment in a reducing gas atmosphere. In the region 50, the flatness of the surface of the germanium substrate 10 is bad before the heat treatment. Thus, the mobility is low. As illustrated in FIG. 2, as the flatness of the surface of the germanium substrate 10 improves, the mobility in the region 50 improves.

The substrate B has many defects in the germanium substrate 10. Thus, the mobility in the region 52 before the heat treatment in a reducing gas atmosphere is low. When the heat treatment is conducted in a reducing gas atmosphere, the defects in the germanium substrate 10 decrease, and the mobility in the region 52 improves. In the region 50, when the heat treatment is conducted at 500° C. or greater, the flatness of the surface of the germanium substrate 10 improves. However, when the heat treatment temperature is less than 700° C., the mobility in the region 50 does not improve as much as that of the substrate A because of the effect of the defect in the germanium substrate 10. As illustrated in FIG. 8, when the temperature of the heat treatment in a reducing gas atmosphere is 700° C. or greater, the defects relating to oxygen in the germanium substrate 10 decrease, and the mobility in the regions 50 and 52 improves.

As described above, the flatness of the surface of the germanium substrate 10 and defects relating to oxygen in the germanium substrate 10 affect the mobility. The flatness is considered to equally affect the substrate A and the substrate B. The substrate B has more defects relating to oxygen. The defects are considered the cause of the low mobility in the substrate B. Therefore, the heat treatment is conducted in a reducing gas atmosphere at 700° C. or greater. This reduces the oxygen concentration in the germanium substrate 10, and improves the mobility.

In the MOS structure with use of a silicon substrate, it has been known that the oxygen concentration in the silicon substrate has little effect on the mobility, and the phenomenon that the mobility relates to oxygen is a unique phenomenon of a Germanium substrate.

An embodiment of the present invention based on the above experimental results will be described hereinafter.

First Embodiment

Figure 12A:
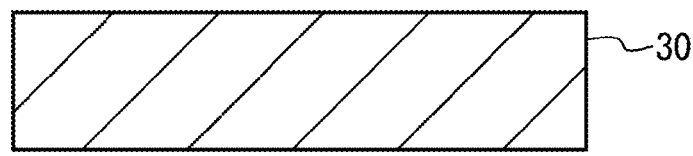
FIG. 12A through FIG. 12E are cross-sectional views illustrating a method of manufacturing a semiconductor device in accordance with a first embodiment.

FIG. 12A through FIG. 12E are cross-sectional views illustrating a method of manufacturing a semiconductor device of a first embodiment. As illustrated in FIG. 12A, prepared is a germanium layer 30 having an oxygen concentration of $1 \times 10^{16}$ cm$^{-3}$ or greater. When the scattering due to the defect is supposed to be the cause of the decrease in the mobility, the germanium layer 30 may be a single crystal germanium substrate, or may be a germanium film formed on a substrate (for example, a silicon substrate). Alternatively, the germanium layer 30 may be high-purity germanium, or may contain impurities. For example, the germanium layer 30 may be n-type or p-type germanium. Furthermore, the germanium layer 30 may contain silicon as long as the effect of the above experiments is obtained. The composition ratio of silicon is required to be approximately 10% or less of the total. The principal plane of the germanium layer 30 may be any plane, and may be, for example, a (100) plane, a (111) plane, or a (110) plane. The (100) plane, the (111) plane, and the (110) plane respectively include crystal planes equivalent to the (100) plane, the (111) plane, and the (110) plane. The principal plane may be a few degrees off from these planes. That is to say, the normal direction of the principal plane may be inclined at a few degrees or less, preferably one degree or less, from the <111> orientation or the <110> orientation.

Figure 12B:

As illustrated in FIG. 12B, the surface of the germanium layer 30 is heat-treated in a reducing gas atmosphere at 700° C. or greater. The reducing gas is a gas that hardly reacts with the germanium layer 30 by the heat treatment and reduces (or removes) oxygen in the germanium layer 30. A hydrogen gas may be used as the reducing gas, for example. Alternatively, a mixed gas of a hydrogen gas and an inert gas may be used. Examples of the inert gas include, for example, nitrogen gas, and a gas of the XVIII-family element such as helium (He), neon (Ne), argon (Ar), krypton (Kr), xenon (Xe) or radon (Rn). A mixed gas of the above-described gases may be used. The reducing gas may not necessarily contain a hydrogen gas. For example, a gas containing little oxygen and hardly reacting with the germanium layer 30 by the heat treatment may be used as long as the gas removes oxygen in the germanium layer 30 by the heat treatment. For example, a nitrogen gas containing little oxygen may be used. As described above, the gas used for the heat treatment preferably contains little oxygen. The gas pressure of the heat treatment may be 1 atm, less than 1 atm, or greater than 1 atm.

Figure 12C:
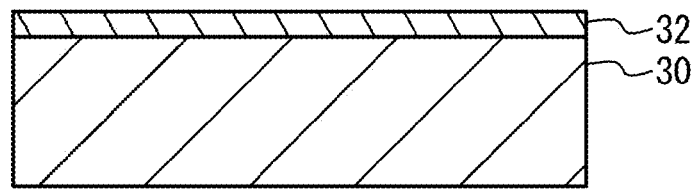

As illustrated in FIG. 12C, a gate insulating film 32 is formed on the surface of the germanium substrate 30. As the gate insulating film 32, a germanium oxide film, a high permittivity insulating film, or a multilayered film of a germanium oxide film and a high permittivity insulating film may be used. As the high permittivity insulating film, a rare-earth metal oxide film such as hafnium oxide, zirconium oxide, or yttrium oxide may be used. The film thickness of the gate insulating film 32 is preferably 2 nm or less, more preferably 1.5 nm or less, further preferably 1.0 nm or less.

Figure 12D:
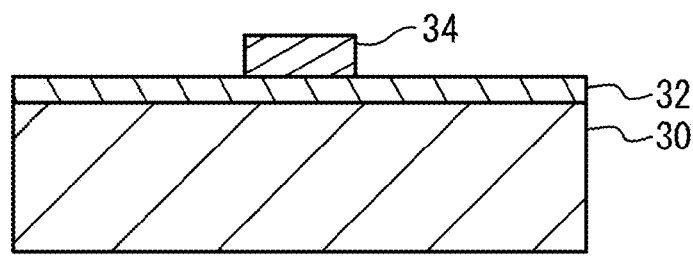

As illustrated in FIG. 12D, a gate electrode 34 is formed on the gate insulating film 32. As the gate electrode 34, a conductive layer such as a metal or a Semiconductor may be used.

Figure 12E:
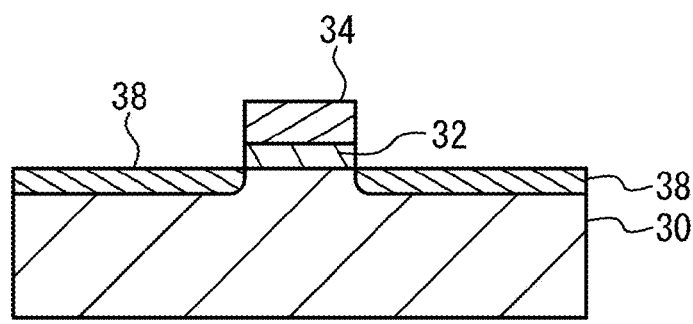

As illustrated in FIG. 12E, a source or drain region 38 is formed on the germanium layer 30 at both sides of the electrode 34. The germanium layer 30 is p-type, and the source or drain region 38 is n-type. The germanium layer 30 may be n-type, and the source or drain region 38 may be p-type. In an n-channel FET, the use of the germanium layer 30 having a (111) plane as a principal plane improves the performance. In a p-channel FET, the use of the germanium layer 30 having a (100) plane or a (110) plane as a principal plane improves the performance.

According to the first embodiment, the surface of the germanium layer 30 having an oxygen concentration of $1 \times 10^{16}$ cm$^{-3}$ or greater is heat-treated in a reducing gas atmosphere at 700° C. or greater. This improves the mobility of the germanium layer 30, and improves the performance of the semiconductor device.

When the oxygen concentration is $1.2 \times 10^{16}$ cm$^{-3}$ or greater, the mobility especially decreases. Thus, the heat treatment is conducted preferably in a reducing gas atmosphere.

The heat treatment in a reducing gas atmosphere reduces the oxygen concentration of the germanium layer 30 to less than $1 \times 10^{16}$ cm$^{-3}$. Accordingly, the mobility of the germanium layer 30 is improved. The oxygen concentration is preferably $8 \times 10^{15}$ cm$^{-3}$ or less, more preferably $5 \times 10^{15}$ cm$^{-3}$ or less.

The heat treatment temperature is preferably 750° C. or greater, more preferably a temperature greater than 800° C., more preferably 800° C. or greater, further preferably 850° C. or greater. The heat treatment time is preferably 1 minute or greater, more preferably 5 minutes or greater, further preferably 15 minutes or greater.

When the heat treatment time is long, the heat treatment temperature may be low. When the heat treatment temperature is high, the heat treatment time may be short. The heat treatment is required to be conducted so that the oxygen concentration of the germanium layer 30 is reduced.

The first embodiment describes a MOSFET as an example. However, the first embodiment can be applied to semiconductor devices other than the MOSFET.

The first embodiment mainly describes a semiconductor device. However, the execution of the process up to FIG. 12B enables manufacture of a semiconductor substrate. The semiconductor substrate may be a single crystal germanium substrate, or a substrate formed by forming a germanium layer on a support substrate such as a silicon substrate or a glass substrate. The germanium layer may be any of single crystal, multicrystal, and amorphous.

Figure 13:
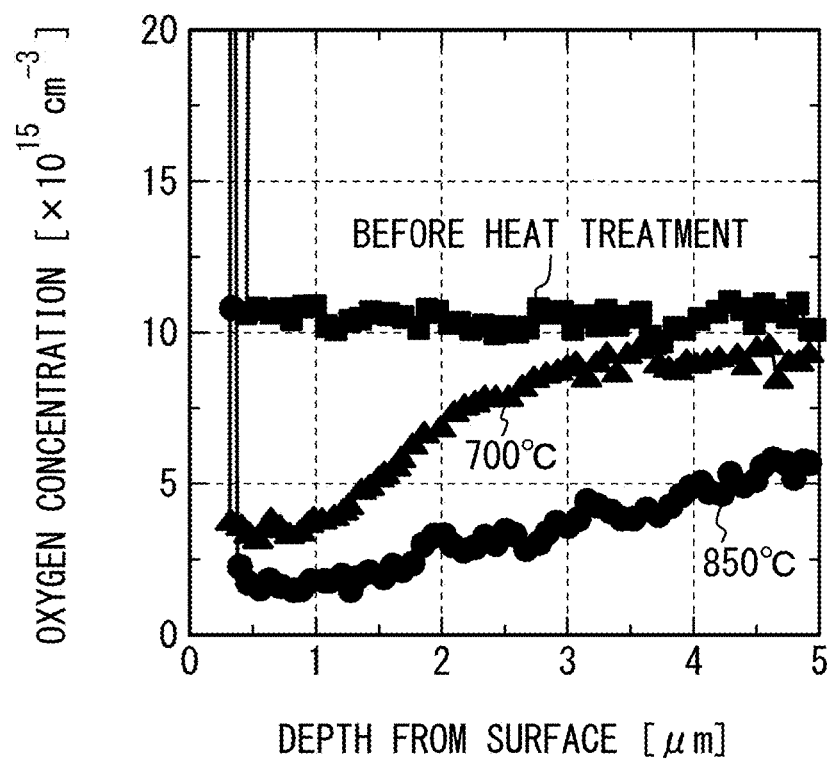
FIG. 13 is a graph of oxygen concentration versus depth in the (111) substrate B.

The same sample as the sample of FIG. 7 was analyzed by SIMS when the SIMS apparatus had a detection limit of the oxygen concentration lower than the detection limit when the analysis of FIG. 7 was conducted. FIG. 13 is a graph of oxygen concentration versus depth in the (111) substrate B. The black squares represent the results of the SIMS analysis before the (111) substrate B underwent the hydrogen heat treatment, the black triangles represent the results of the SIMS analysis after the (111) substrate B underwent the hydrogen heat treatment at 700° C., and the black circles represent the results of the SIMS analysis after the (111) substrate B underwent the hydrogen heat treatment at 850° C. The detection limit of oxygen is approximately $1 \times 10^{15}$ cm$^{-3}$.

As illustrated in FIG. 13, in the substrate B before the hydrogen heat treatment, the oxygen concentration is $1 \times 10^{16}$ cm$^{-3}$ or greater at a depth of less than at least 5 μm. When the substrate B undergoes the hydrogen heat treatment at 700° C., the oxygen concentration in the substrate B decreases to $1 \times 10^{16}$ cm$^{-3}$ or less. Especially at a depth of 2 μm or less, the oxygen concentration decreases. At a depth of 1.5 μm or less, the oxygen concentration is approximately $5 \times 10^{15}$ cm$^{-3}$ or less. At a depth of 1 μm or less, the oxygen concentration is approximately $4 \times 10^{15}$ cm$^{-3}$ or less. When the substrate B is heat-treated at 850° C., the oxygen concentration further decreases. At a depth of 4 μm or less, the oxygen concentration is approximately $5 \times 10^{15}$ cm$^{-3}$ or less. At a depth of 1.5 μm or less, the oxygen concentration is approximately $2 \times 10^{15}$ cm$^{-3}$. As described above, as the temperature of the hydrogen heat treatment is increased, the oxygen concentration in the germanium substrate 10 decreases. The oxygen concentration in the channel region near the surface of the germanium substrate cannot be detected, but is considered to be almost the same as the oxygen concentration at a depth of approximately 1 μm.

When FIG. 13 is compared with FIG. 8, as the temperature of the hydrogen heat treatment increases, the oxygen concentration in the substrate B decreases, and the electron mobility improves. When the temperature of the hydrogen heat treatment is 700° C., the oxygen concentration in the channel region is considered to be approximately $4 \times 10^{15}$ cm$^{-3}$. At this time, the peak electron mobility is 500 to 700 cm$^2$/Vs. When the heat treatment temperature is 850° C., the oxygen concentration in the channel region is considered to be approximately $2 \times 10^{15}$ cm$^{-3}$, and the electron mobility is approximately the same as that of the substrate A illustrated in FIG. 2. As described above, when the heat treatment temperature is configured to be 850° C. or greater, the oxygen concentration in the channel region becomes approximately $2 \times 10^{15}$ cm$^{-3}$ or less. This configuration enables to achieve the electron mobility approximately the same as the electron mobility of the substrate A.

Although preferred embodiments of the present invention have been described so far, the present invention is not limited to those particular embodiments, and various changes and modifications may be made to them within the scope of the invention claimed herein.

DESCRIPTION OF REFERENCE NUMERALS

10 germanium substrate
12 germanium oxide film
30 germanium layer
32 gate insulating film
34 gate electrode
38 source or drain region

The invention claimed is:

1. A semiconductor substrate comprising:
   a germanium layer in which an oxygen concentration at 1 μm from a surface of the germanium layer is less than an oxygen concentration at 5 μm from the surface and is less than $1 \times 10^{16}$ cm$^3$.

2. The semiconductor substrate according to claim 1, wherein the oxygen concentration at 1 μm from the surface is $4 \times 10^{15}$ cm$^{-3}$ or less.

3. The semiconductor substrate according to claim 1, wherein the germanium layer has a (111) plane as a principal plane.

4. The semiconductor substrate according to claim 1, wherein the germanium layer is a single crystal germanium substrate.

5. A semiconductor device comprising:
   a semiconductor substrate including a germanium layer in which an oxygen concentration at 1 μm from a surface of the germanium layer is less than an oxygen concentration at 5 μm from the surface and is less than $1 \times 10^{16}$ cm$^{-3}$.

6. The semiconductor device according to claim 5, further comprising:
   a gate insulating film formed on the surface of the germanium layer; and
   a gate electrode formed on the gate insulating film.

* * * * *